(12) United States Patent
Deboy (10) Patent No.: US 9,310,445 B2
(45) Date of Patent: Apr. 12, 2016

(54) POWER SOURCE ARRANGEMENT AND METHOD OF DIAGNOSING A POWER SOURCE ARRANGEMENT

(71) Applicant: Infineon Technologies Austria AG, Villach (AT)

(72) Inventor: Gerald Deboy, Klagenfurt (AT)

(73) Assignee: Infineon Technologies Austria AG, Villach (AU)

( * ) Notice: Subject to any disclaimer, the term of this patent is extended or adjusted under 35 U.S.C. 154(b) by 0 days.

(21) Appl. No.: 14/561,874

(22) Filed: Dec. 5, 2014

(65) Prior Publication Data

US 2015/0084669 A1    Mar. 26, 2015

Related U.S. Application Data

(62) Division of application No. 13/283,147, filed on Oct. 27, 2011, now Pat. No. 8,933,721.

(51) Int. Cl.
| | |
|---|---|
| *G01R 31/40* | (2014.01) |
| *G01R 31/02* | (2006.01) |
| *H02S 50/10* | (2014.01) |
| *G01R 19/00* | (2006.01) |
| *G01R 31/42* | (2006.01) |
| *G01R 31/317* | (2006.01) |

(52) U.S. Cl.
CPC ............... *G01R 31/40* (2013.01); *G01R 19/00* (2013.01); *G01R 19/0038* (2013.01); *G01R 31/025* (2013.01); *H02S 50/10* (2014.12); *G01R 31/31721* (2013.01); *G01R 31/42* (2013.01); *Y10T 307/50* (2015.04); *Y10T 307/707* (2015.04)

(58) Field of Classification Search
CPC .. G01R 31/2605; G01R 31/405; G01R 31/40; G01R 31/025; G01R 31/08; G01R 31/024; G01R 31/31721; G01R 31/42; G01R 19/16538; G01R 19/165; G01R 19/155
USPC ........ 324/761.01, 522, 512, 764.01, 555, 606
See application file for complete search history.

(56) References Cited

U.S. PATENT DOCUMENTS

| | | | |
|---|---|---|---|
| 6,034,506 | A | 3/2000 | Hall |
| 6,265,846 | B1 | 7/2001 | Flechsig et al. |
| 6,278,052 | B1 | 8/2001 | Takehara et al. |
| 6,580,249 | B2 | 6/2003 | Yau et al. |

(Continued)

FOREIGN PATENT DOCUMENTS

| | | | |
|---|---|---|---|
| CN | 1124847 | A | 6/1996 |
| CN | 2648675 | Y | 10/2004 |

(Continued)

*Primary Examiner* — Tung X Nguyen
*Assistant Examiner* — Thang Le
(74) *Attorney, Agent, or Firm* — Slater & Matsil, L.L.P.

(57) ABSTRACT

An embodiment method of diagnosing a power source arrangement includes a plurality of n power sources connected in series between output terminals, wherein $n \geq 2$. At least two different groups of power sources are selected from the power source arrangement. A voltage of each of the at least two different groups is measured between the output terminals. During the measurement of the voltage of one group, the power sources of the power source arrangement that do not belong to the one group are bypassed. The at least two measured voltages obtained through measuring the voltage of each of the at least two different groups or at least two voltages that are dependent on these at least two measured voltages are compared.

19 Claims, 6 Drawing Sheets

(56) References Cited

U.S. PATENT DOCUMENTS

| | | |
|---|---|---|
| 6,822,423 B2 | 11/2004 | Yau et al. |
| 7,656,164 B2 * | 2/2010 | Kawamura ............ G01R 31/362 320/116 |
| 8,054,034 B2 | 11/2011 | Lim et al. |
| 8,574,735 B2 | 11/2013 | Matsuura et al. |
| 8,723,483 B2 | 5/2014 | Shimizu |
| 2003/0160593 A1 * | 8/2003 | Yau ....................... H02J 7/0018 320/116 |
| 2007/0257642 A1 | 11/2007 | Xiao |
| 2008/0090133 A1 | 4/2008 | Lim et al. |
| 2009/0174411 A1 * | 7/2009 | Yudahira et al. .............. 324/433 |
| 2010/0244847 A1 | 9/2010 | Kudo et al. |
| 2010/0259104 A1 | 10/2010 | Winkleman |
| 2010/0289338 A1 | 11/2010 | Stauth |
| 2010/0321026 A1 | 12/2010 | Matsuura |
| 2011/0018580 A1 * | 1/2011 | Tamagawa et al. ...... 324/764.01 |
| 2011/0031976 A1 * | 2/2011 | Ishikawa et al. .............. 324/433 |
| 2011/0127839 A1 | 6/2011 | Takano |
| 2011/0127963 A1 * | 6/2011 | Murao .................. H02J 7/0016 320/118 |
| 2011/0199051 A1 | 8/2011 | Shimizu |
| 2011/0260770 A1 * | 10/2011 | Sekiguchi ............ G01R 31/362 327/333 |
| 2011/0273182 A1 * | 11/2011 | Butzmann ............. H02J 7/0021 324/433 |
| 2012/0053867 A1 | 3/2012 | Dunn |
| 2012/0065936 A1 | 3/2012 | Singamsetti |
| 2012/0176079 A1 * | 7/2012 | Nakashima et al. .......... 320/101 |
| 2012/0199172 A1 * | 8/2012 | Avrutsky ...................... 136/244 |
| 2012/0247542 A1 | 10/2012 | Ammer |

FOREIGN PATENT DOCUMENTS

| | | |
|---|---|---|
| CN | 1582522 A | 2/2005 |
| CN | 101459267 A | 6/2009 |

* cited by examiner

POWER SOURCE ARRANGEMENT AND METHOD OF DIAGNOSING A POWER SOURCE ARRANGEMENT

This application is a divisional of Non-Provisional application Ser. No. 13/283,147, filed on Oct. 27, 2011, which application is hereby incorporated herein by reference in its entirety.

TECHNICAL FIELD

Embodiments of the present invention relate to a power source arrangement, in particular a power source arrangement including several power sources, such as photovoltaic (PV) modules, connected in series.

BACKGROUND

With an increasing interest in sustainable energy production there is a focus on using photovoltaic modules for producing electric power. Photovoltaic (PV) modules include a plurality of photovoltaic (PV) cells, that are also known as solar cells. Usually several solar modules are connected in series to form a string of modules. A DC output voltage provided by the string may then be converted into an AC voltage, such as, for example, a voltage suitable to be supplied to a power grid or to drive a motor.

In an ideal case each of the modules connected in series provides the same output voltage. In real photovoltaic arrangements there may be modules that provide a lower voltage than other modules. This may be due to wear, corrosion of contacts within the module, and the like.

In order to optimize the output of a solar arrangement with a plurality of PV modules a Maximum Power Point (MPP) tracker may be coupled to each of the modules. The MPP trackers monitor the output powers of the individual modules and operate the individual modules in their MPP. Through the MPP trackers the output powers of the individual modules are known so that a deviation of the output power of one module from the output power of other modules may easily be detected, so that suitable measures can be taken.

MPP trackers, however, are expensive so that in large solar power plants a MPP tracker is at most coupled to one string with a plurality of modules but not to the individual modules.

Nevertheless, there is a need to monitor in a cost efficient way the output voltage of power sources, such as PV modules, in a string with a plurality of power sources connected in series.

SUMMARY OF THE INVENTION

A first aspect relates to a method of diagnosing a power source arrangement including a plurality of n power sources connected in series between output terminals, wherein $n \geq 2$. The method includes at least one voltage comparison. The at least one voltage comparison includes selecting at least two different groups of power sources from the power source arrangement, and measuring the voltage of each group between the output terminals, wherein during the measurement of the voltage of one group the power sources of the power source arrangement that do not belong to the one group are bypassed. The method further includes comparing the at least two measured voltages obtained through measuring the voltage of each of the at least two groups, or comparing voltages dependent on these at least two measured voltages.

A second aspect relates to a circuit arrangement including a power source arrangement having output terminals and a plurality of n power sources connected in series between the output terminals, wherein $n \geq 2$, and a diagnostic circuit coupled to the power source arrangement. The diagnostic circuit is configured to select at least two different groups of power sources from the power source arrangement, to measure the voltage of each group between the output terminals, wherein during the measurement of the voltage of one group the power sources of the power source arrangement that do not belong to the one group are bypassed, and to compare the at least two measured voltages obtained through measuring the voltage of each of the at least two groups, or to compare voltages dependent on these at least two measured voltages.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 5 which includes FIG. 6 which includes

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
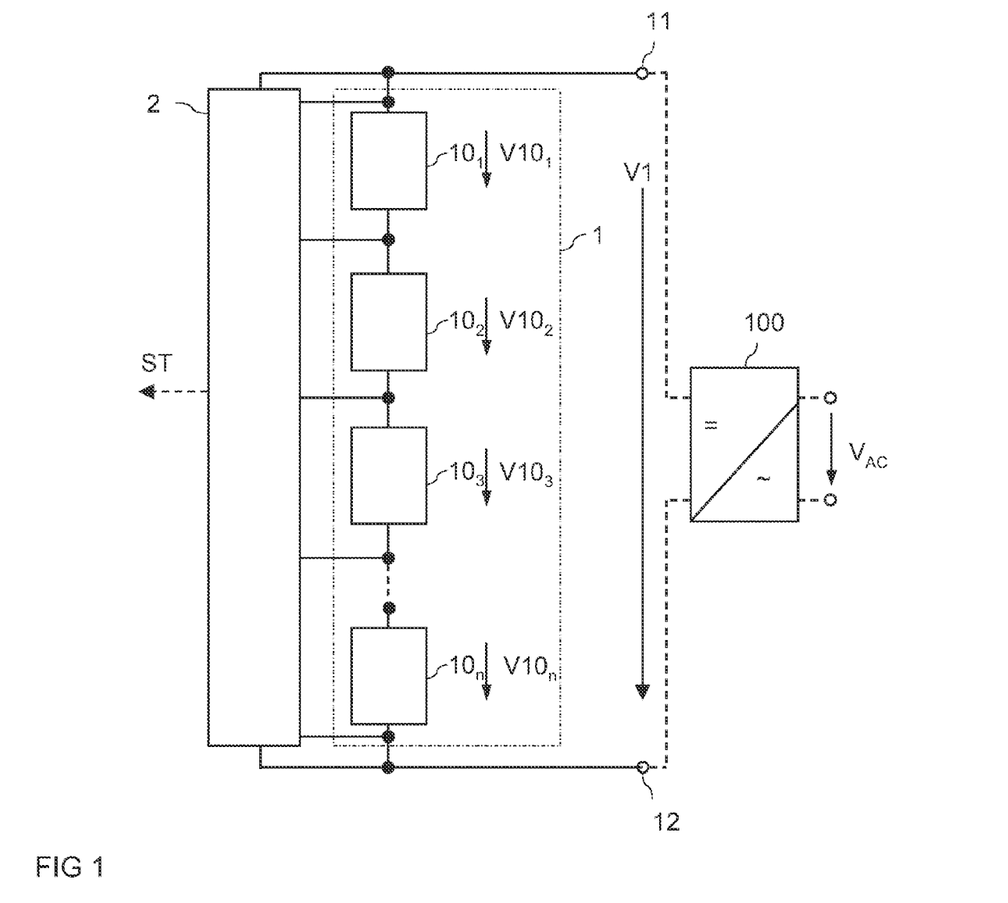
FIG. 1 schematically illustrates a first embodiment of a circuit arrangement that includes a power source arrangement with a plurality of power sources and a diagnostic circuit.

FIG. 1 illustrates a first embodiment of a circuit arrangement. The circuit arrangement includes a power source arrangement 1 with a plurality of n, wherein $n \geq 2$, power sources $10_1, 10_2, 10_3, 10_n$ connected in series between output terminals 11, 12 of the power source arrangement 1. In operation of the power source arrangement 1 each of the power sources $10_1, 10_2, 10_3, 10_n$ provides an output voltage $V10_1, V10_2, V10_3, V10_n$, so that an output voltage V1 of the power source arrangement 1 between the output terminals 11, 12 corresponds to the sum of the individual output voltages:

$$V1 = \sum_{i=1}^{n} V10_i \quad (1)$$

According to one embodiment, the individual power sources $10_1$-$10_n$ are DC power sources, so that the output voltage V1 of the power source arrangement 1 is a DC output voltage. Optionally, an inverter 100 is connected to the output terminals 11, 12 and is configured to generate an AC output voltage $V_{AC}$ from the DC output voltage V1 provided by the power source arrangement 1. Any type of DC power sources can be implemented in the power source arrangement 1, such as photovoltaic (PV) modules or battery modules, such as lithium-ion battery modules.

The individual power sources $10_1$-$10_n$ are configured such that in a normal operation of the power source arrangement 1 the individual power sources $10_1$-$10_n$ provide approximately equal output voltages $V10_1$-$V10_n$. However, there may be scenarios in which the output voltage of one of the power sources $10_1$-$10_n$ is lower than the output voltages of other power sources. In a photovoltaic arrangement with a plurality of power sources implemented as PV modules the output voltage of one PV module can be lower than the output power of other PV modules when (for example, due to shading) the solar power received by the one PV module is lower than the solar power received by the other modules. While this is a natural scenario, there may be scenarios in which a lower output voltage of one power source is the result of a defect in the power source. It is therefore desired to detect whether the power source arrangement 1 includes a power source $10_1$-$10_n$ that provides an output voltage (supply voltage) lower than output voltages of the other power sources $10_1$-$10_n$. Specifically, it is desired to detect which of the power sources $10_1$-$10_n$ provides a lower output voltage.

Referring to FIG. 1, the circuit arrangement includes a diagnostic circuit 2. The diagnostic circuit 2 has input terminals coupled to the output terminals 11, 12 of the power source arrangement 1 and is configured to measure the voltage between these output terminals. The diagnostic circuit 2 is further configured to operate the power source arrangement 1 in a diagnostic mode and is configured in the diagnostic mode to at least detect whether there is a power source in the power source arrangement 1 that provides an output voltage lower than the output voltages of other power sources $10_1$-$10_n$ in the power source arrangement 1. In the diagnostic mode, the diagnostic circuit 2 is configured to select at least two different groups of power sources from the power source arrangement, to measure the voltage of each group between the output terminals 11, 12, where during the measurement of the voltage of one group the power sources of the power source arrangement 1 that do not belong to the one group are bypassed, and to compare the at least two voltages obtained through measuring the voltage of each of the at least two groups. In the diagnostic mode, the output voltage V1 corresponds to the sum of the output voltages of the power sources of one group, which are the power sources that are not bypassed. Details and further embodiments of the method will be explained herein further below.

Figure 2:
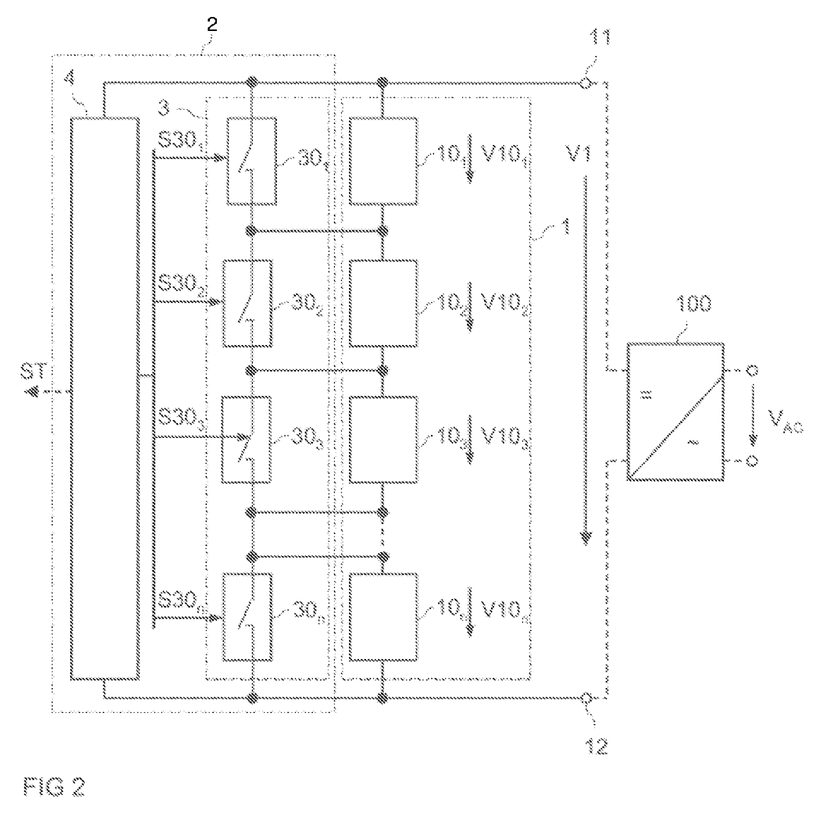
FIG. 2 illustrates a first embodiment of the diagnostic circuit.

An embodiment of the diagnostic circuit 2 is illustrated in greater detail in FIG. 2. The diagnostic circuit 2 of FIG. 2 includes a bypass circuit 3 and a measurement and control circuit 4. The bypass circuit 3 includes at least one bypass unit coupled to one power source, whereas in the embodiment illustrated in FIG. 2, each power source $10_1$-$10_n$ has a bypass unit $30_1$-$30_n$ coupled thereto, so that the number of bypass units $30_1$-$30_n$ of the bypass circuit 3 equals the number of power sources $10_1$-$10_n$. A power source, such as, for example, a first power source $10_1$, and the corresponding bypass unit, such as, for example, a first bypass unit $30_1$, are connected in parallel.

Each bypass unit $30_1$-$30_n$ is in signal communication with the measurement and control circuit 4 and is configured to bypass the associated power source dependent on a control signal $S30_1$, $S30_2$, $S30_3$, $S30_n$ received from the measurement and control circuit 4. The signal communication path between the measurement and control circuit 4 and the individual bypass units $30_1$-$30_n$ is only schematically illustrated in FIG. 2. Any type of signal communication path that is suitable to transmit the control signals $S30_1$-$S30_n$ to the bypass circuit 3 may be employed. According to one embodiment there is a transmission channel between the measurement and control circuit 4 and each of the bypass units $30_1$-$30_n$ so that there is a dedicated transmission channel for each of the control signals $S30_1$-$S30_n$. According to another embodiment there is signal bus that couples the measurement and control circuit 4 to the bypass units $30_1$-$30_n$. The control signals $S30_1$-$S30_n$ are transmitted via the signal bus, where the bypass units $30_1$-$30_n$ are configured to "listen to the bus" and to receive their corresponding control signal $S30_1$-$S30_n$ from the bus. Any type of signal bus and the corresponding transmission protocol may be employed for the signal communication between the measurement and control circuit 4 and the bypass units $30_1$-$30_n$.

Assigning one bypass unit $30_1$-$30_n$ to each power source $10_1$-$10_n$ is only an example. The number of bypass units $30_1$-$30_n$ could be less than the number of power sources $10_1$-$10_n$, so that there are power sources that have no bypass unit connected thereto, or so that one bypass unit is connected in parallel to a series circuit with at least two power sources.

Figure 3:
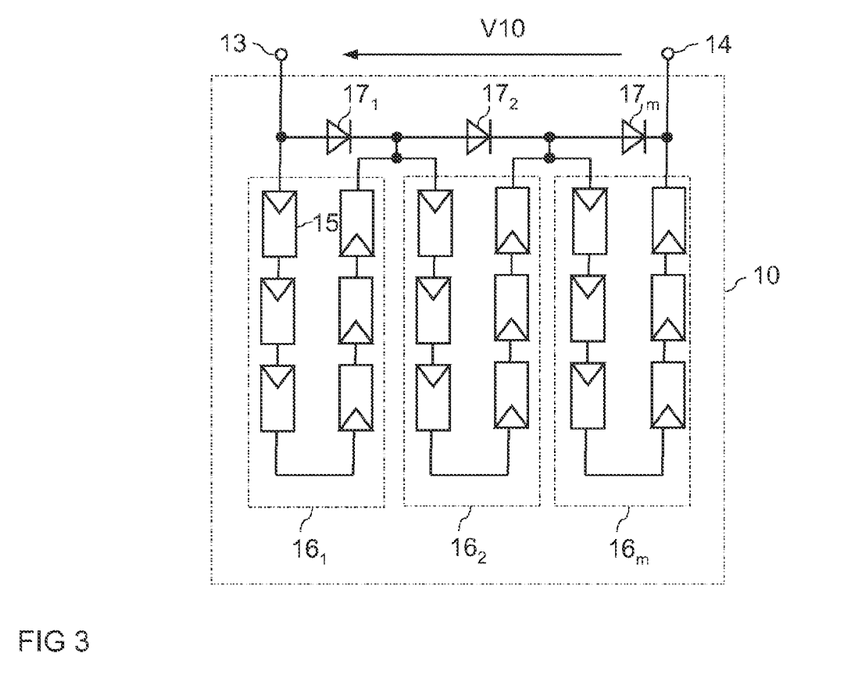
FIG. 3 illustrates a first embodiment of a power source implemented as a photovoltaic (PV) module.

FIG. 3 illustrates a first embodiment of one power module 10. The power module 10 illustrated in FIG. 3 represents an arbitrary one of the power modules $10_1$-$10_n$ illustrated in FIGS. 1 and 2. According to one embodiment, the individual power modules $10_1$-$10_n$ of the power source arrangement 1 have the same architecture, which means they are implemented in the same way.

The power module 10 of FIG. 3 is implemented as a solar or photovoltaic (PV) module and includes a plurality of solar cells 15 connected in series between output terminals 13, 14 of the power module 10. Between the output terminals 13, 14 of the power module 10, the output voltage V10 of the power module 10 is available. The output terminals 13, 14 serve to connect the individual power modules ($10_1$-$10_n$ in FIGS. 1 and 2) in series between the output terminals 11, 12 of the power source arrangement 1. The number of solar cells 15 connected in series within the PV module 10 is dependent on the specific application. According to one embodiment, the number of solar cells 15 connected in series is between 48 and 72. According to one embodiment, the number of solar cells in the individual power sources or PV modules $10_1$-$10_n$ is equal.

Referring to FIG. 3, the series circuit with the solar cells 15 is optionally subdivided into a plurality of m series circuits (sub-circuits) $16_1$, $16_2$, $16_m$ of solar cells. A rectifier element $17_1$, $17_2$, $17_m$, such as a diode, is connected in parallel with each of these sub-circuits $16_1$, $16_2$, $16_m$. According to one embodiment, the module 10 includes m=3 sub-circuits and, therefore, m=3 rectifier elements $17_1$, $17_2$, $17_m$. The number of solar cells 15 in the individual sub-circuits $16_1$, $16_2$, $16_m$ may be equal, such as, for example, between 16 and 24, dependent on the overall number of solar cells 15 in the power module 10.

The rectifier elements $17_1$-$17_m$ are bypass elements that are configured to bypass the corresponding sub-circuits $16_1$-$16_m$. A rectifier element $17_i$ bypasses the corresponding sub-circuit $16_i$ (where $16_i$ and $17_i$ denote one of the sub-circuits and the corresponding rectifier element) when, for example, the solar cells 15 of the corresponding sub-circuit $16_i$ receive a solar power that is less then the solar power received by the solar cells 15 of the other sub-circuits. This is explained in the following.

For explanation purposes it is at first assumed that the PV module 10 is connected to other power sources implemented as PV modules and that the power source arrangement (1 in FIG. 1) is connected to a load, so that there is an output current at the output terminals 13, 14 of the PV modules. Further, it is assumed that the solar power received by the individual solar cells of the PV module 10 is equal, so that the individual solar cells 15 provide equal output currents that correspond to the output current at the output terminals 13, 14 of the PV module 10. In this operation mode, each of the individual solar cells 15 acts as a current source. When, however, solar cells of one sub-circuit $16_i$ of the sub-circuits $16_1$-$16_m$ receive a lower solar power than the solar cells of the other sub-circuits, these solar cells lose their capability to provide the required output current. Absent the rectifier element $17_i$, voltages across these solar cells would change their polarity and these solar cells would behave like loads in which a part of the electrical power provided by other solar cells is consumed. This would significantly reduce the efficiency of the PV module 10. The rectifier element $17_i$ clamps the voltage across one sub-circuit $16_i$ to the forward voltage of the rectifier element $17_i$ when the polarity of the voltage across the sub-circuit $16_i$ changes its polarity when one or several solar cells 15 of the corresponding sub-circuit are in a load mode. The power losses that may occur in one sub-circuit $16_i$ that has at least one solar cell operated in the load-mode are limited through the rectifier elements $17_1$-$17_m$.

Of course, more than one sub-circuit in the PV module can be bypassed at once. For example, each of the sub-circuits $16_1$-$16_m$ of one PV module 10 can be bypassed by the corresponding rectifier element $17_1$-$17_m$ when, for example, the solar cells of one PV module 10 receive a lower solar power than the solar cells of other PV modules connected in series with the one PV module 10.

Instead of diodes, as illustrated in FIG. 3, other types of rectifier elements may be used as well for implementing the rectifier elements $17_1$, $17_2$, $17_m$. According to one embodiment (not shown), the rectifier elements $17_1$, $17_2$, $17_m$ are electronic switches, such as transistors, that are connected to a drive circuit that switches a rectifier element on each time the voltage across the corresponding sub-circuit changes the polarity. Implementing the rectifier elements $17_1$, $17_2$, $17_m$ as electronic switches further allows to apply a diagnostic procedure as explained with reference to FIGS. 1 and 2 to one individual PV module in order to detect whether there is a sub-circuit in the PV module that provides a lower supply voltage than other sub-circuits in the PV module.

Figure 4:
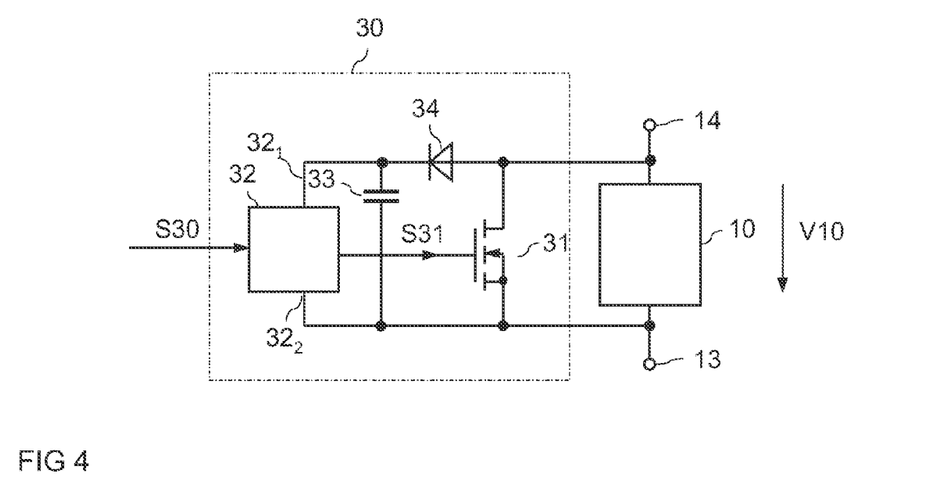
FIG. 4 illustrates one embodiment of a bypass circuit of the diagnostic circuit.

FIG. 4 schematically illustrates an embodiment of one bypass unit 30 and of a power source 10 coupled thereto. The bypass unit 30 in FIG. 4 represents an arbitrary one of the bypass units $30_1$-$30_n$ illustrated in FIG. 2. The control signal S30 illustrated in FIG. 5 represents the control signal received by the bypass unit 30 from the measurement and control circuit (not illustrated in FIG. 4).

Referring to FIG. 4, the bypass unit 30 includes an electronic switch 31, such as a transistor, having a load path and a control terminal. The load path of the electronic switch 31 is connected in parallel with the power source 10. The bypass unit 30 further includes a control unit 32 that receives the control signal S30 and that is configured to drive the electronic switch 31 dependent on the control signal S30. The control unit 32 generates a drive signal S31 received at the control terminal of the electronic switch 31. In the embodiment illustrated in FIG. 4, the electronic switch 31 is a transistor, in particular an n-type MOSFET. However, implementing the electronic switch 31 as n-type MOSFET is only an example. The electronic switch 31 could also be implemented as any other type of transistor, such as a p-type MOSFET or an IGBT, or as any other type of electronic switch.

The control unit 32 includes power supply terminals $32_1$, $32_2$ coupled to the power source 10. Optionally, a charge storage element 33, such as a capacitor, is coupled between the supply terminals $32_1$, $32_2$ and is coupled to the power source 10 via a rectifier element 34, such as a diode. The charge storage element 33 is charged by the power source 10 via the rectifier element 34 when the power source 10 provides an output voltage V10 other than zero. When the output voltage V10 of the power source 10 decreases, the charge storage element 33 provides for a sufficient power supply of the control circuit 32 in order to switch the electronic switch 31 to the desired switching state (on or off). The rectifier element 34 prevents the charge storage element 33 from being discharged when the supply voltage V10 of the power source 10 decreases.

In the embodiment illustrated in FIG. 4, the supply voltage provided to the control unit 32 and the charge storage element 33, respectively, is about the output voltage V10 of the power source 10. However, this is only an example. According to a further embodiment (not illustrated) the supply voltage provided to the control unit 32 is derived from the output voltage V10 but is lower than the output voltage V10.

The control unit 32 switches the electronic switch 31 on or off dependent on the control signal S30. The bypass unit 30 bypasses the power source 10 when the electronic switch 31 is switched on. The control circuit 32 is configured to receive the control signal S30 and to generate the drive signal S31 dependent on the control signal S30. The control circuit 32 further includes a receiver or interface circuit that is configured to be in signal communication with the measurement control circuit 4. When, for example, there is a signal bus between the measurement and control circuit 4 and the individual bypass units, such as the bypass unit 30 illustrated in FIG. 5, the control circuit 32 includes a bus interface circuit that is configured to listen to the bus and to retrieve those control signals from the bus that are dedicated to the individual bypass unit. Different types of signal busses and the corresponding bus interfaces that are commonly known may be employed in the circuit arrangement.

Referring to FIG. 2, the measurement and control circuit 4 is configured to selectively drive the individual bypass units $30_1$-$30_n$ to bypass the corresponding power sources $10_1$, $10_2$, $10_3$, $10_n$, and to measure the output voltage V1 between the output terminals 11, 12 in order to diagnose the power source arrangement 1. When at least one of the power sources $10_1$-$10_n$ is bypassed, the output voltage V1 corresponds to the sum of the output voltages of those power sources that are not bypassed. The possibility to selectively bypass individual power sources $10_1$-$10_n$ offers the opportunity to diagnose the power source arrangement 1 without directly measuring the voltages at the output terminals of the individual power sources $10_1$-$10_n$, which in many applications are not accessible anyway.

A first embodiment of a method of diagnosing the power source arrangement is now explained with reference to FIGS. 5A and 5B. These figures schematically illustrate a power source arrangement 1 with a plurality of n=8 power sources $10_1$-$10_n$ connected in series. However, employing n=8 power sources is only an example, any number of power sources other than 8 may be employed as well. In this embodiment, each power source $10_1$-$10_n$ has a bypass unit $30_1$-$30_n$ coupled thereto. Since in the following explanation only the operation state of the bypass units is relevant, which means whether the individual bypass units $30_1$-$30_n$ bypass the associated power source $10_1$-$10_n$ or do not bypass the associated power source $10_1$-$10_n$, the bypass units $30_1$-$30_n$ are only schematically illustrated as switches that are either switched on or switched off in FIGS. 6A and 6B. Referring to the explanation above, the switches in the bypass units $30_1$-$30_n$ are controlled by the measurement and control circuit 4 (not illustrated in FIGS. 5A and 5B).

Figure 5A:
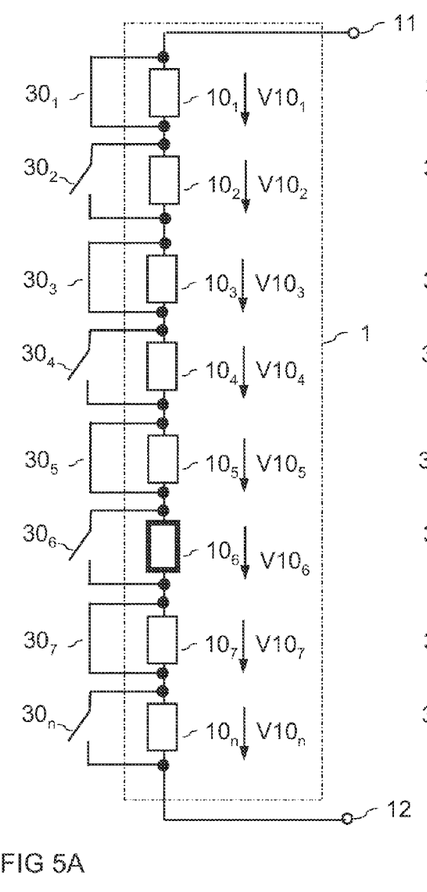
FIGS. 5A and 5B, illustrates a first embodiment of a method of diagnosing a power source arrangement.
Figure 5B:
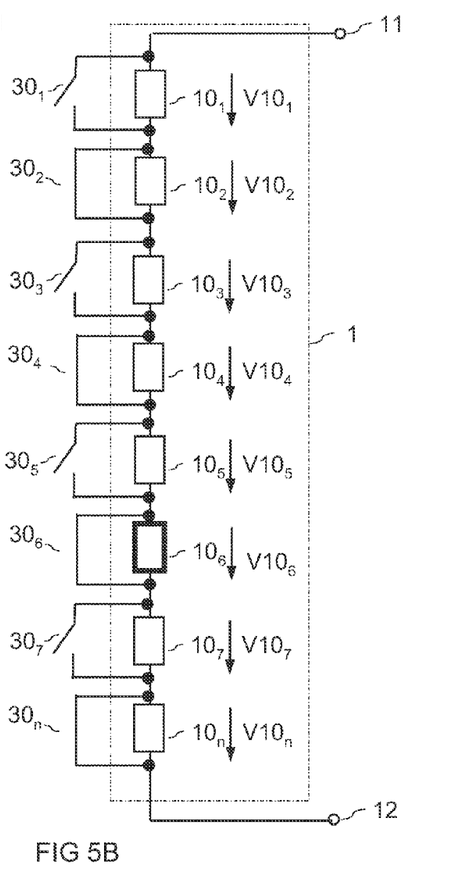

In the diagnostic method at least two different groups of power sources are selected from the power source arrangement 1 and the voltage of each group is measured between the output terminals 11, 12 by the measurement and control circuit 4 (not illustrated in FIGS. 5A and 5B). During the measurement of the voltage of one group the power sources of the power source arrangement 1 that do not belong the one group are bypassed. In the embodiment illustrated in FIGS. 5A and 5B two different groups of power sources are selected from the power source arrangement 1, namely a first group including the power sources $10_2$, $10_4$, $10_6$, $10_n$, and a second group including the power sources $10_1$, $10_3$, $10_5$, $10_7$. Referring to FIG. 5A, the voltage of the first group, which is the sum of the output voltages $V10_2$, $V10_4$, $V10_6$, $V10_n$ of the power sources of the first group is measured, while the power sources of the second group are bypassed. This voltage of the first group will be referred to as first voltage in the following. Referring to FIG. 5B, the voltage of the second group, which is the sum of the output voltages $V10_1$, $V10_3$, $V10_5$, $V10_7$, of the power sources of the second group, is measured while the power sources of the first group are bypassed. The voltage of the second group will be referred to as second voltage in the following. The first and second voltages are compared in order to detect the presence of an error or fault in the power source arrangement 1.

The individual bypass units $30_1$-$30_n$ are driven by the measurement and control circuit 4 in order to bypass the power sources of the second group when the first voltage is measured and in order to bypass the power sources of the first group when the second voltage is measured. Further, the first and second voltages that are available between the output terminals 11, 12, of the power source arrangement 1 are measured by the measurement and control circuit 4. However, for the ease of illustration this measurement and control circuit 4 is not illustrated in FIGS. 5A and 5B.

For explanation purposes it is assumed that there is an error or fault in one of the power sources, such as, for example, in the power source $10_6$, so that an output voltage $V10_6$ of this power source $10_6$ is lower than the output voltages of the other power sources. The power source $10_6$ will be referred to as defect power source in the following. In the present embodiment, the defect power source $10_6$ is part of the first group, so that the first voltage is lower than the second voltage. According to one embodiment, the presence of an error in the power source arrangement 1 is assumed when the magnitude of a difference between the first and second voltages is above a given threshold value. The "threshold value" can be an absolute value or can be a relative value that is dependent on one of the measured voltages. According to one embodiment, the threshold value is between 5% and 20% of one of the first and second voltages.

In the embodiment illustrated in FIGS. 5A and 5B two different groups of power sources are selected from the power source arrangement 1. However, this is only an example. According to a further embodiment, two or more groups of power sources are selected from the power source arrangement 1 and the voltage of each of these groups is measured, while the power sources of the other groups are bypassed. The voltage of each group is then compared to the voltage of at least one other group, in order to detect, whether there is a group that has a lower voltage than the other groups. The number of groups that are selected and of which the voltages are measured, is arbitrary. However, the individual groups have the same number of power sources in this method. The groups are selected such that there is at least one power source in each group that is not included in the other group.

It is even possible to individually measure the voltage of each power source $10_1$-$10_n$. In this case, all the power sources except for the power source that is to be measured are bypassed. According the one embodiment, the voltage across each power source is measured. This corresponds to selecting n groups of power sources with each of these groups including only one power source. According to one embodiment, the voltage measured for one power source is compared to the voltage of at least one neighboring power source, wherein an error of one power source is detected, when the voltage of this power source is significantly lower than the voltage of a neighboring power source. "Significantly lower" means the voltage of one power source is more than a given threshold value lower than the voltage of the neighboring power source. The "threshold value" can be an absolute value or can be a relative value that is dependent on one of the measured voltages. According to one embodiment, the threshold value is between 5% and 20% of one of the measured voltages.

Although in the embodiment illustrated in FIGS. 5A and 5B the first group includes those power sources $10_2$, $10_4$, $10_6$, $10_n$ of the power source arrangement 1 having an even order number and the second group includes those power sources $10_1$, $10_3$, $10_5$, $10_7$ with an odd order number, this is only an example. The power sources that belong to one group can be selected arbitrarily. According to one embodiment, the two groups are disjunct, which means that there is no power source of the power source arrangement 1 that belongs to both of these groups of power sources.

In the embodiment explained above, the voltages of at least two groups are compared that have the same number of power sources. However, this is only an example. According to a further embodiment, voltages of at least two groups are measured that have different numbers of power sources. In this method, in addition to measuring the voltages of the two groups a calculation step is performed that calculates for each group a normalized voltage from the calculated voltage. The normalized voltage is dependent on the measured voltage and the number of power sources in each group. For explanation purposes it is assumed that the voltage $V1_p$ of a first group of power sources with p power sources is measured and that the voltage $V1_q$ of a second group of power sources with q power sources is measured. p and q denote the numbers of power sources in the individual groups, with p and q being different. According to one embodiment, calculating the normalized voltages includes dividing the measured voltages $V1_p$, $V1_q$ by the numbers q and n, respectively, so that $$V1_{p,n} = V1_p/p \qquad (1a)$$

$$V1_{q,n} = V1_q/q \qquad (1a)$$

where $V1_{p,n}$ denotes the first normalized voltage of the first group and $V1_{q,n}$ denotes the second normalized voltage of the second group.

The normalized voltages are then compared in order to determine whether one of the groups of power sources includes a power source that provides a lower output voltage than the other power sources in the first and second group. The presence of a power source providing a lower output voltage is assumed when the magnitude of the difference between the first and second normalized voltages is above a given threshold value. The "threshold value" can be an absolute value or can be a relative value that is dependent on one of the measured voltages. According to one embodiment, the threshold value is between 5% and 20% of one of the first and second voltages.

The first and second group of power sources may overlap, which means that there can be power sources that are included in both, the first and the second group of power sources. However, since the numbers p and q of power sources in the two groups are different, there is always at least one power source that is only included in one of the groups.

According to one embodiment, p=1 and q>1 so that the first group includes only one (p=1) power source, while the second group includes more than one power source. However, this is only an example. In general, the number of power sources in each group is arbitrary.

Calculating normalized voltages from the measured voltages of the individual groups allows the comparison of the measurement results of groups with different numbers of power sources. However, even in those cases in which groups with the same number of power sources are compared, normalized values of the measured voltages can be calculated and the normalized values instead of the measured values can be compared in order to detect whether one group of power sources includes a power source providing a lower output voltage than the other power sources.

According to a further embodiment, not only the presence of an error is detected, but the power source in which the error is present, is identified. For this, a hierarchical diagnostic method is performed. This hierarchical method is based on a method as explained before, which is a method in which one group of power sources is identified which is assumed to include a defect power source. One of the methods explained before is then applied to this group in order to identify a sub-group that includes the defect power source, where the method is then applied to the sub-group and so on, until a group including only one power source is identified that includes the defect power source.

An embodiment of a hierarchical method explained with reference to FIGS. 6A to 6D is based on the method explained with reference to FIGS. 5A and 5B for identifying one of a plurality of groups that includes a defect power source. However, each of the other methods explained before may be used as well.

Figure 6A:
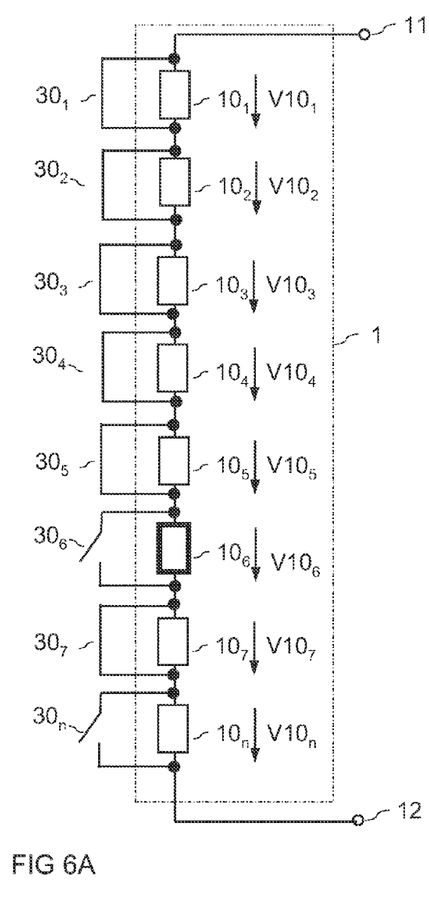
FIGS. 6A, 6B, 6C and 6D illustrates a further embodiment of a method of diagnosing a power source arrangement.
Figure 6B:
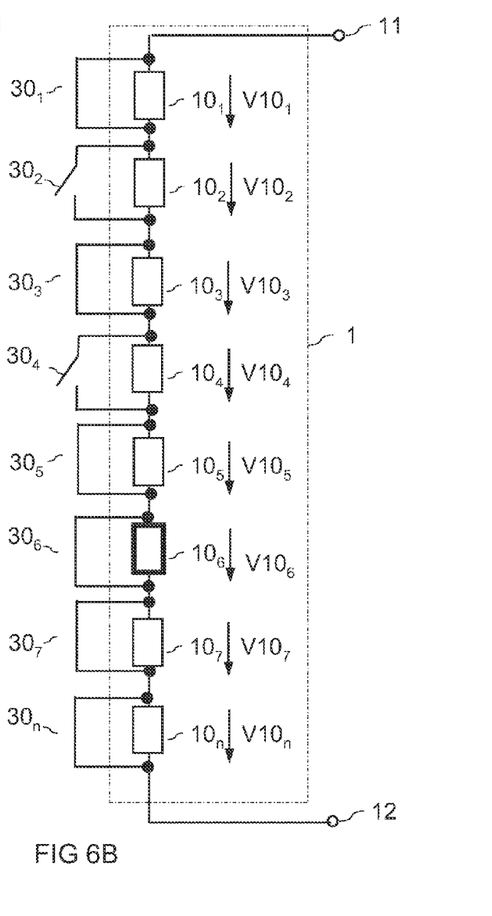
Figure 6C:
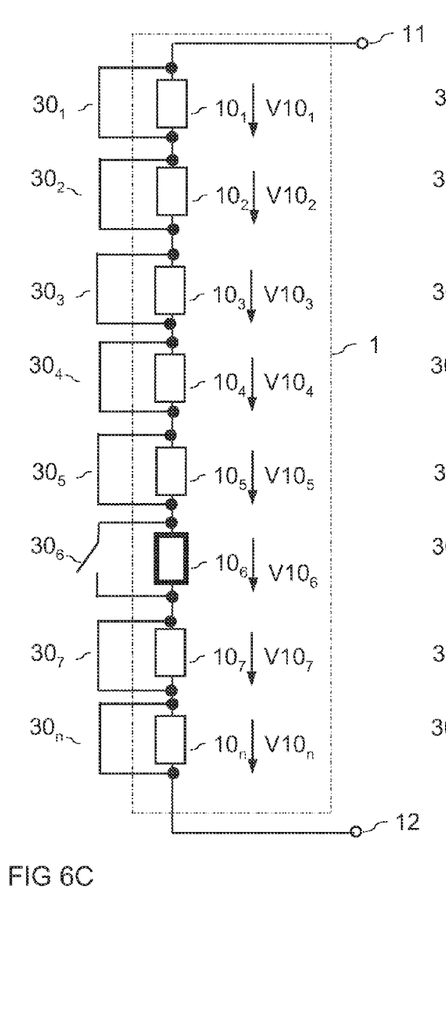
Figure 6D:
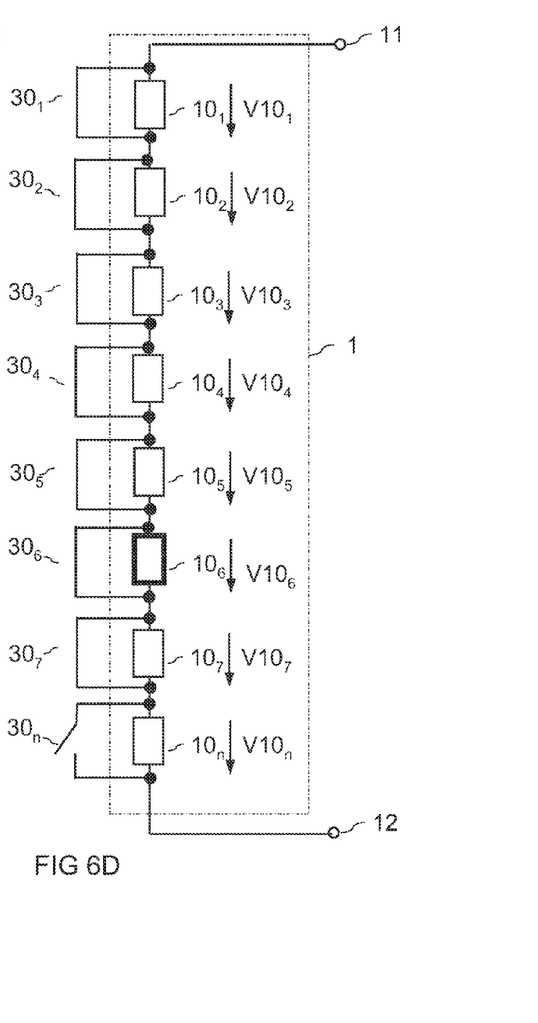

For explanation purposes it is assumed that the first group as explained with reference to FIGS. 6A and 6B includes the defect power source $10_6$. In order to identify which of the power sources of the second group includes the defect, at least two groups of power sources from this first group are selected and the voltages of these groups are measured and the measured voltages or the normalized voltages are compared. During measurement of the voltage of one group, the other power sources, which are the power sources not belonging to this group, are bypassed. Referring to FIGS. 6A and 6B the first group is subdivided into two subgroups, namely a first subgroup which in the present embodiment includes the power source $10_6$ and $10_n$ and a second subgroup which includes the power sources $10_2$ and $10_4$. Since the first subgroup includes the defect power source $10_6$, the voltage of the first subgroup is lower than the voltage of the second subgroup. Since the first subgroup still includes several power sources, namely two power sources $10_6$, $10_n$ in the present embodiment, the subgroup is again subdivided into further subgroups, which in the present embodiment each only include one power source, so that measuring the voltage of these subgroups corresponds to measuring the voltage of only one power source. These method steps are illustrated in FIGS. 6C and 6D, wherein in the method step illustrated in FIG. 6C, the voltage of the defect power source $10_6$ is measured, while in the method step illustrated in FIG. 6D the voltage of the power source $10_n$ is measured. By comparing these voltages power source $10_6$ can be identified to be a defect power source, because the voltage $V10_6$ of this power source is lower than the voltage $V10_n$ of the other power source.

Subdividing each group which has been identified to include a defect power source into only two subgroups is only an example. Each of these groups could also be subdivided in more than two subgroups in the way explained with reference to FIGS. 5A and 5B. Further, instead of selecting the individual groups to be compared such that they include the same number of power sources, these groups could also be selected such that they include a different number of power sources. In this case, the normalized voltages instead of the measured voltages are compared.

According to one embodiment, the measurement and control circuit 4 includes an status output and the measurement and control circuit 4 is configured to provide a status signal ST (illustrated in dashed lines in FIGS. 1 and 2) that indicates whether there is an error in one of the power sources $10_1$-$10_n$ and/or which of the power sources includes an error. According to one embodiment, the inverter 100 (see FIG. 1) receives the status signal ST and forwards the status signal or an information dependent on the status signal to a supervision entity, such as an operator of a solar power plant in which the circuit arrangement is employed. In this case, the inverter 100 includes a communication interface through which the information can be forwarded via a conventional communication system, such as the internet or a telephone network.

The voltage measured at the output terminals 11, 12 of the power source arrangement 1 can be an open circuit voltage, which is the voltage when there is no load connected to the output terminals 11, 12. According to a further embodiment, the voltage between the output terminals 11, 12 is measured when a load is connected to the output terminals 11, 12. According to one embodiment, the load can be implemented as an inverter 100 as illustrated in FIG. 1. This inverter 100 may include a Maximum Power Point track (MPP). This MPP is configured to operate the power source arrangement 1 in the Maximum Power Point, which is the operation point in which the power source arrangement 1 (in particular when implemented as a power source arrangement with PV modules as power sources) has the maximum efficiency. Since the MPP may vary when during the diagnostic process power sources are bypassed, the adjustment of the MPP may take some time, such as up to several seconds. According to one embodiment, there is therefore a delay time between selecting a new group of power sources, which includes bypassing those power sources not belonging to the group, and measuring the output voltage between the output terminals 11, 12.

According to one embodiment, the measurement and control circuit 4 is configured to regularly forward a status signal to the individual bypass units $30_1$-$30_n$, with this status signal simply indicating that the measurement and control circuit 4 is active. According to one embodiment, the bypass units are configured to bypass the associated power sources when no status signal has been received from the measurement and control circuit 4 for a given time period, such as a time period in the range of several seconds. In this case, the complete power source arrangement 1 is bypassed, thereby reducing the DC voltage between its output terminals 11, 12 to zero.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit arrangement comprising:
    a power source arrangement comprising output terminals and a plurality of n power sources connected in series between the output terminals, wherein n≥2; and
    a diagnostic circuit coupled to the power source arrangement,
    the diagnostic circuit configured to select at least two different groups of power sources from the power source arrangement,
    the diagnostic circuit configured to measure a voltage of each of the at least two different groups between the output terminals, wherein during the measurement of the voltage of one group of the power sources of the power source arrangement that do not belong to the one group are bypassed, and
    the diagnostic circuit configured to compare the at least two measured voltages obtained through measuring the voltage of each of the at least two groups or to compare at least two voltages dependent on these at least two measured voltages, wherein, when a difference between two of the measured voltages or between two of the voltages dependent on the measured voltages is higher than a threshold value, the diagnostic circuit is
        a) configured to select at least two different groups of power sources from a group that has a lowest voltage;
        b) configured to measure the voltage of each group between the output terminals, wherein during the measurement of the voltage of one group the power sources of the power source arrangement that do not belong to the one group are bypassed; and
        c) configured to compare the at least two measured voltages obtained through measuring the voltage of each group, or to compare two voltages dependent on the at least two measured voltages.

2. The circuit arrangement of claim 1, wherein the diagnostic circuit is configured to select individual groups having a same number of power sources and that are disjunct.

3. The circuit arrangement of claim 2, wherein the diagnostic circuit is configured to select two groups, each comprising n/2 power sources.

4. The circuit arrangement of claim 1 wherein the diagnostic circuit is further configured to provide a diagnostic signal dependent on a result of the comparison.

5. The circuit arrangement of claim 4, wherein the diagnostic circuit is configured to generate the diagnostic signal to assume an error level when a difference between two of the at least two measured voltages or between two of the at least two voltages dependent on the measured voltages is higher than a given threshold value.

6. The circuit arrangement of claim 1, wherein the diagnostic circuit is further configured to repeat steps a) to b) until the group having the lowest voltage does only include one power source.

7. The circuit arrangement of claim 1, wherein the diagnostic circuit further comprises:
    a bypass circuit coupled to the power source arrangement; and
    a measurement and control circuit configured to measure a voltage between the output terminals and configured to control the bypass circuit.

8. The circuit arrangement of claim 7, wherein the bypass circuit further comprises:
    at least one bypass unit coupled to one power source and configured to bypass the power source it is coupled to as controlled by the measurement and control circuit.

9. The circuit arrangement of claim 8, wherein each power source has a bypass unit coupled thereto.

10. The circuit arrangement of claim 8, wherein the at least one bypass unit comprises:
    a switching element connected in parallel with its associated power source; and
    a control unit coupled to the measurement and control circuit and configured to drive the switching element dependent on a control signal received from the measurement and control circuit.

11. The circuit arrangement of claim 10, wherein the control unit is configured to switch the switching element on upon expiration of a give time period in which no control signal has been received from the measurement and control circuit.

12. The circuit arrangement of claim 1, wherein the diagnostic circuit is configured the measure an open circuit voltage at the output terminals.

13. The circuit arrangement of claim 1, further comprising:
    a Maximum Power Point Tracker (MPP) connected to the output terminals,
    wherein the diagnostic circuit is configured to measure a MPP voltage of each group.

14. The circuit arrangement of claim 1, wherein each power source comprises a photovoltaic module with a plurality of solar cells connected in series.

15. A diagnostic circuit configured to be coupled to a power source arrangement having output terminals and a plurality of n power sources connected in series between the output terminals, wherein n≥2, the diagnostic circuit comprising:
    a plurality of switching elements configured to select at least two different groups of power sources from the power source arrangement,
    a measurement and control circuit coupled to the plurality of switching elements, the measurement and control circuit configured to measure a voltage of each of the at least two different groups between the output terminals and control the plurality of switching elements to bypass power sources that do not belong to a group being measured, and compare the at least two measured voltages obtained through measuring the voltage of each of the at least two groups or to compare at least two voltages dependent on these at least two measured voltages, wherein when a difference between two of the measured voltages or between two of the voltages dependent on the measured voltages is higher than a threshold value, the measurement and control circuit is configured to a) select at least two different groups of power sources from a group that has a lowest voltage, b) measure the voltage of each of the at least two different groups between the output terminals and control the plurality of switching elements to bypass power sources that do not belong to a group being measured, and c) compare the at least two measured voltages obtained through measuring the voltage of each of the at least two groups or to compare at least two voltages dependent on these at least two measured voltages.

16. The diagnostic circuit of claim 15, wherein the measurement and control circuit is further configured to repeat steps a) to b) until the group having the lowest voltage only includes one power source.

17. The diagnostic circuit of claim 15, further comprising a plurality of control units coupled between the measurement and control circuit and the plurality of switching elements, wherein each of the plurality of control units is configured to drive a corresponding switching element of the plurality of switching element based on a control signal received from the measurement and control circuit.

18. The diagnostic circuit of claim 17, wherein each of the plurality of switching elements are configured to be coupled in parallel with a corresponding power source.

19. A circuit comprising:

a measurement and control circuit configured to be coupled to power cells, measurement and control circuit configured to:

select a first group of power cells, select a second group of power cells different from the first group of power cells, measure a first voltage across the first group of power cells while bypassing the second group of power cells, wherein bypassing comprises activating a first conductive path coupled in parallel with the second group of power cells, measure a second voltage across the second group of power cells while bypassing the first group of power cells, wherein bypassing comprises activating a second conductive path coupled in parallel with the first group of power cells, determine a difference between the first voltage and the second voltage, when the difference between the first voltage and the second voltage is greater than a threshold, select the first group when the first voltage is lower than the second voltage and selecting the second group when the second voltage is lower than the first voltage, divide the selected group into at least two further groups, and measure voltages across power cells of the at least two further groups.

* * * * *